United States Patent
Gotoh et al.

(10) Patent No.: US 9,281,795 B2
(45) Date of Patent: Mar. 8, 2016

(54) ACOUSTIC SIGNAL PROCESSING APPARATUS

(75) Inventors: Mitsutaka Gotoh, Hamamatsu (JP); Mizuyuki Shirai, Hamamatsu (JP); Yuji Yamashita, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 989 days.

(21) Appl. No.: 13/277,150

(22) Filed: Oct. 19, 2011

(65) Prior Publication Data

US 2012/0099741 A1 Apr. 26, 2012

(30) Foreign Application Priority Data

Oct. 20, 2010 (JP) .................................. 2010-235365

(51) Int. Cl.
*H03G 9/00* (2006.01)
*H03G 9/18* (2006.01)
*H04R 5/04* (2006.01)

(52) U.S. Cl.
CPC ... *H03G 9/18* (2013.01); *H04R 5/04* (2013.01)

(58) Field of Classification Search
CPC ......... H03G 3/20; H03G 5/165; H03G 9/025; H03G 5/025; H03G 3/3005; H04R 3/04; H04S 7/307
USPC .................................................. 381/102, 108
See application file for complete search history.

(56) References Cited

U.S. PATENT DOCUMENTS

| 2008/0069385 | A1 | 3/2008 | Revit | |
|---|---|---|---|---|
| 2010/0150379 | A1* | 6/2010 | Craig et al. | ................... 381/108 |

FOREIGN PATENT DOCUMENTS

| EP | 0 287 057 A2 | 10/1988 |
|---|---|---|
| EP | 0 287 057 A3 | 10/1988 |
| JP | 64-051706 A | 2/1989 |
| WO | WO-2006/018808 A1 | 2/2006 |

OTHER PUBLICATIONS

European Search Report mailed Mar. 1, 2012, for EP Patent Application No. 11185869.2, six pages.

* cited by examiner

*Primary Examiner* — Joseph Saunders, Jr.
(74) *Attorney, Agent, or Firm* — Morrison & Foerster LLP

(57) ABSTRACT

An acoustic signal's high frequency component extracted by an HPF 13 is multiplied in a multiplier 16 by the first coefficient to control the level of the high frequency component. The first coefficient is generated by a coefficient generation portion 21 in accordance with the full band level of an output signal. A low frequency component extracted by an LPF 15 is multiplied in a multiplier 17 by the second coefficient to control the level of the low frequency component. The second coefficient is generated by a coefficient generation portion 24 in accordance with the level of the output signal's low frequency component extracted by an LP filter 22. The level control of the low frequency component of the output signal and the level control of the high frequency component of the output signal are done separately, resulting in the loudness control which is suitable for the characteristic of the acoustic signal.

10 Claims, 5 Drawing Sheets

ACOUSTIC SIGNAL PROCESSING APPARATUS

BACKGROUND OF THE INVENTION

1. Field of the Invention

The present invention relates to an acoustic signal processing apparatus which controls an acoustic signal to make the frequency response of tone volume of the acoustic signal appropriate to a set tone volume.

2. Description of the Related Art

It has been known that the human auditory sense has a characteristic that the perception of loudness varies depending on frequency band. For example, the loudness perception decreases in low frequencies and high frequencies. Because of this characteristic, when the whole volume is reduced on an acoustic apparatus, tones based on low frequencies and high frequencies of acoustic signals are hard to be heard, losing balance of the whole loudness perception. In order to compensate such a human auditory sense, conventional acoustic apparatuses are equipped with a loudness capability for emphasizing low frequencies and high frequencies of acoustic signals when the set tone volume is reduced, as described in Japanese Unexamined Patent Publication No. 64-51706, for example. The loudness capability keeps balance of the whole loudness perception by increasing the gains of low frequencies and high frequencies when the whole tone volume is reduced.

SUMMARY OF THE INVENTION

FIG. 6 indicates a circuit block diagram indicative of an example configuration of a conventional volume and loudness control circuit 100. In the volume and loudness control circuit 100 shown in FIG. 6, an input acoustic signal is separated into frequency band components of a high frequency component, a middle frequency component and a low frequency component by a band separation filter group. The band separation filter group is formed of a high-pass filter (HPF) 110 which extracts a high frequency component of an acoustic signal, a band pass filter (BPF) 111 which extracts a middle frequency component of the acoustic signal and a low-pass filter (LPF) 112 which extracts a low frequency component of the acoustic signal. The high frequency component output from the HPF 110 is multiplied in multiplier 113 by a coefficient generated by a coefficient generation portion 119 to control the level of the high frequency component. The low frequency component output from the LPF 112 is multiplied in multiplier 115 by the coefficient generated by the coefficient generation portion 119 to control the level of the low frequency component. The level-controlled high frequency component output from the multiplier 113, the middle frequency component output from the BPF 111 without being level-controlled, and the level-controlled low frequency component output from the multiplier 115 are mixed in a mixing portion 114 to form an output signal. The output signal supplied from the mixing portion 114 is multiplied in a multiplier 116 by a coefficient generated by a coefficient generation portion 118 to control the level of the output signal.

To the coefficient generation portion 118 and the coefficient generation portion 119, information indicative of a rotation angle of a volume knob 117 manipulated by a user is supplied, so that coefficients corresponding to the rotation angle of the volume knob 117 are generated by the coefficient generation portion 118 and the coefficient generation portion 119. In the coefficient generation portion 118, in this case, a coefficient which results in the volume corresponding to the rotation angle of the volume knob 117 is generated to be supplied to the multiplier 118. In the coefficient generation portion 119, when the volume knob 117 is set at a rotation angle indicative of a low volume, a coefficient which is a gain exceeding "1" is generated to be supplied to the multiplier 113 and the multiplier 115. In the coefficient generation portion 119, when the volume knob 117 is set at a rotation angle which exceeds the low volume range, a coefficient which is a gain of "1" is generated to be supplied to the multiplier 113 and the multiplier 115. Consequently, the conventional volume and loudness control circuit 100 performs the loudness control which raises the low frequency component and the high frequency component when the user sets the volume knob 117 at a low volume.

The conventional volume and loudness control circuit 100 shown in FIG. 6 is disadvantageous in that the coefficients supplied from the coefficient generation portion 119 to the multiplier 113 and the multiplier 115 are identical, ending up uniform level-controlled frequency response on tone volume. Such uniform frequency response does not always suit the characteristic of acoustic signals. As the whole volume level increases, more specifically, a high frequency component of an acoustic signal becomes too loud. Therefore, it is preferable to restrain the high frequency component that is to be output from a speaker. In addition, it is preferable to output a low frequency component from the speaker as much as the speaker permits. However, the conventional apparatus has a problem that it is unable to perform such preferred level control.

An object of the present invention is to provide an acoustic signal processing apparatus which controls an acoustic signal to make the frequency response of tone volume of the acoustic signal appropriate to a set volume.

In order to achieve the above-described object, the present invention provides an acoustic signal processing apparatus which inputs an acoustic signal and forms an output acoustic signal which is to be supplied to a sound system including an amplifier and a speaker, the acoustic signal processing apparatus including a band separation portion which separates the input acoustic signal into a high frequency component, a middle frequency component and a low frequency component; a first level control portion which controls a level of the high frequency component in accordance with a first control signal to output the controlled high frequency component; a second level control portion which controls a level of the low frequency component in accordance with a second control signal to output the controlled low frequency component; a mixing portion which mixes the high frequency component output from the first level control portion, the middle frequency component output from the band separation portion and the low frequency component output from the second level control portion to output a mixed signal; a first control signal generation portion which detects a volume level of the mixed signal to generate the first control signal in accordance with the detected volume level; and a second control signal generation portion which detects a volume level of a low frequency component of the input acoustic signal to generate the second control signal in accordance with the detected volume level.

According to the present invention, the acoustic signal processing apparatus detects the volume level of the mixed signal to control the high frequency component level of the acoustic signal in accordance with the detected volume level, while detecting the volume level of the low frequency component of the input acoustic signal to control the low frequency component level of the acoustic signal in accordance with the detected volume level. Therefore, the acoustic signal processing apparatus according to the present invention controls an acoustic signal to make the frequency response of the acoustic signal appropriate to the rotation angle of a volume knob.

DESCRIPTION OF THE PREFERRED EMBODIMENT

Figure 1:
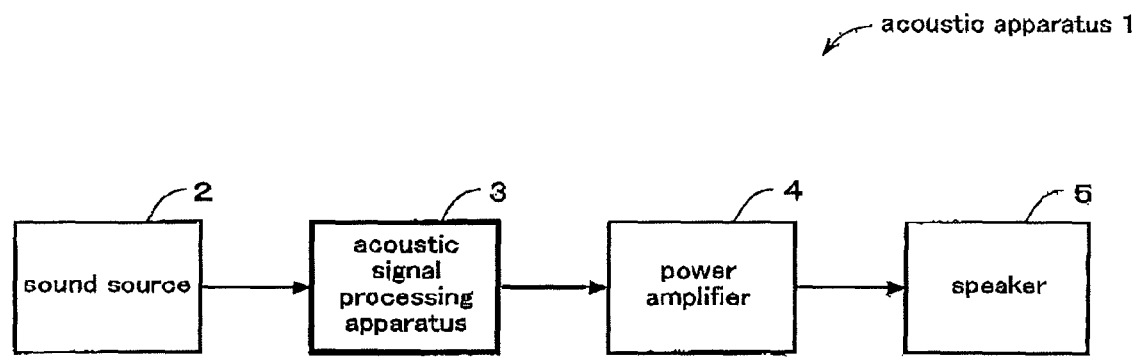
FIG. 1 is a block diagram indicative of a configuration of an acoustic apparatus to which an acoustic signal processing apparatus according to an embodiment of the present invention is applied.

FIG. 1 indicates the configuration of the acoustic apparatus to which the acoustic signal processing apparatus according to an embodiment of the present invention is applied. In an acoustic apparatus 1 indicated in FIG. 1, a sound source 2 is an apparatus from which acoustic signals which are to be reproduced by a speaker 5 are supplied. The sound source 2 can be a CD player, a recorder, a mixer or the like. The acoustic signals supplied from the sound source 2 are input to an acoustic signal processing apparatus 3 of the present invention. In order to supply acoustic signals to the specific speaker 5, the acoustic signal processing apparatus 3 performs signal processing referred to as "speaker processing" which is signal processing specifically provided for the speaker 5. The acoustic signals processed by the acoustic signal processing apparatus 3 are power-amplified by a power amplifier 4 to be supplied to the speaker 5 to be emitted as tones. The speaker 5 can be a full range speaker formed of a single speaker for the full band, a 2-way speaker formed of a speaker for high frequencies (tweeter) and a speaker for low frequencies (woofer), a 3-way speaker formed of a speaker for high frequencies (tweeter), a speaker for middle frequencies (squawker) and a speaker for low frequencies (woofer), or the like.

The acoustic signal processing apparatus 3 controls input acoustic signals by adjusting various kinds of acoustic characteristics of the acoustic signals such as volume control corresponding to a rotation angle of a volume knob, loudness control and the like. By the volume control, the acoustic signal processing apparatus 3 controls the volume of an acoustic signal to have a gain (the rate of amplification or the rate of attenuation) corresponding to the rotation angle of the volume knob. As for the loudness control, for the level control of a high-frequency component, defining the full range level of an acoustic signal to be output as a reference input level, the acoustic signal processing apparatus 3 controls the signal output level of the high-frequency component in accordance with the reference input level. For the level control of a low-frequency component, furthermore, defining the level of a low-frequency component of the acoustic signal to be output as a reference input level, the acoustic signal processing apparatus 3 controls the signal output level of the low frequency component in accordance with the reference input level. For a middle frequency component of the acoustic signal, the acoustic signal processing apparatus 3 will not perform such level control using reference input level. By such controls, when the volume knob is turned down to reduce the volume of the acoustic signal, the acoustic signal processing apparatus 3 performs the loudness control by separately controlling the signal output level of the low frequency component of the acoustic signal and the signal output level of the high frequency component in accordance with the frequency response of the acoustic signal. Therefore, the acoustic signal processing apparatus 3 achieves loudness control most suitable for the characteristic of the acoustic signal.

The acoustic signal processing apparatus 3 can be an independent apparatus which is separate from a power amplifier 4 and the speaker 5. However, the acoustic signal processing apparatus 3 may be integrated into the power amplifier 4, or the acoustic signal processing apparatus 3 and the power amplifier 4 may be integrated into the speaker 5.

Figure 2:
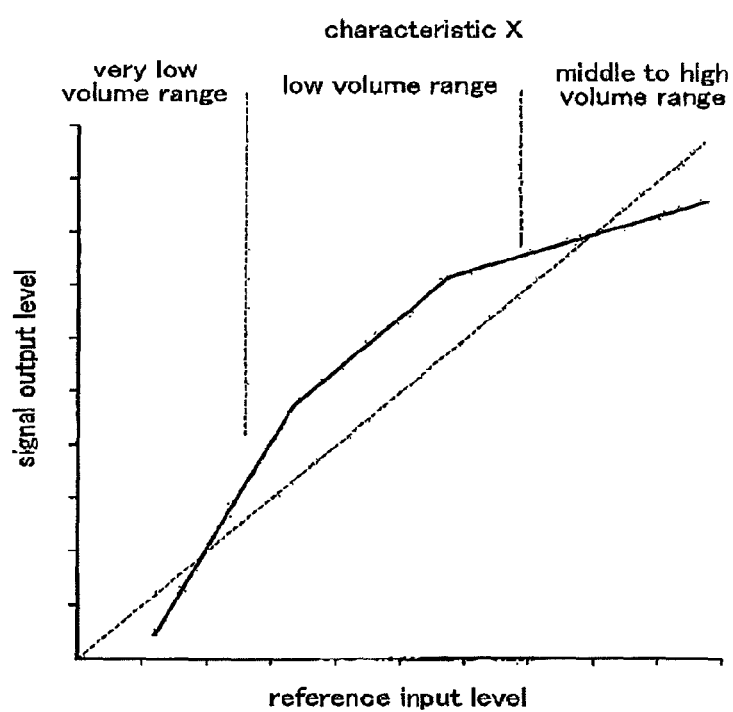
FIG. 2 is a graph indicative of a characteristic X of a signal output level corresponding to a reference input level of the acoustic signal processing apparatus of the embodiment of the present invention.

FIG. 2 indicates an example graph indicative of input/output level characteristic X of an acoustic signal. The input/output level characteristic X is used for the level control by use of a coefficient (corresponding to a gain in decibel scale) generated in accordance with a detected decibel scale level (reference input level).

This figure indicates the characteristic of a case in which an acoustic signal whose level is to be detected is identical to the acoustic signal whose level is to be controlled. Although an acoustic signal whose level is to be detected is different from an acoustic signal whose level is to be controlled in this embodiment, coefficients generated in accordance with reference level are basically the same as those of the case of this figure. The horizontal axis of the graph shown in FIG. 2 indicates the reference input level while the vertical axis indicates the level (signal output level) of a gain-controlled signal. Because the graph is represented by decibel scale, the signal output level is represented as a value obtained by adding a gain to a reference input level (corresponding to multiplication in linear scale). An inclined broken line shown in the graph of FIG. 2 indicates a case where the gain is held constant at 0 decibel (equivalent to "1" in linear scale), so that the level of an acoustic signal to be input equals the level of an acoustic signal to be output. The broken line corresponds to the characteristic of a middle frequency component whose level will not be controlled in accordance with reference input level.

The solid line indicated in the graph of FIG. 2 represents the signal output level of a component (high frequency component or low frequency component) controlled in accordance with the characteristic X, indicating that the gain dynamically varies. In a range where the solid line is above the broken line, more specifically, the gain of the component to be controlled is higher than that of the middle frequency component, resulting in a state where the balance is "lifted". In a range where the solid line is below the broken line, the gain of the component to be controlled is lower than that of the middle frequency component, resulting in a state where the balance is "lowered". Specifically speaking, if the reference input level falls within a low volume range, the component controlled in accordance with the characteristic X stands above the broken line to have the gain exceeding "1" so that the signal output level of the component is higher than that of the middle frequency component. If the reference input level falls within a very low volume range, the component controlled in accordance with the characteristic X gradually descends below the broken line to have the gain which is less than "1" as the reference input level reduces, so that the signal output level of the component is smaller than that of the middle frequency component. If the reference input level falls within a middle-to-high volume range, i.e., a middle or higher range, the component controlled in accordance with the characteristic X gradually comes to be situated below the broken line to have the gain which is less than "1" as the reference input level increases, so that the signal output level of the component is smaller than that of the middle frequency component.

In the low volume range where the gain of the high frequency component or the low frequency component controlled in accordance with the characteristic X exceeds "1", therefore, the loudness control by which the high frequency component or the low frequency component is emphasized is performed. In the very low volume range where the gain of the high frequency component or the low frequency component controlled in accordance with the characteristic X is less than "1", the acoustic signal processing apparatus 3 serves as a noise gate which mutes low input acoustic signals. The very low volume range is a range of such very low volumes as human beings are inaudible. In the range of the middle and higher volume range where the gain of the high frequency component or the low frequency component controlled in accordance with the characteristic X is less than "1", furthermore, the acoustic signal processing apparatus 3 restrains application of high power acoustic signals to the speaker to prevent the speaker from being damaged.

Using the full range level of an acoustic signal to be output as a reference input level, the acoustic signal processing apparatus 3 according to the present invention controls the level of a high frequency component in accordance with the characteristic X. Using the level of a low frequency component of the acoustic signal to be output as a reference input level, in addition, the acoustic signal processing apparatus 3 controls the level of the low frequency component in accordance with the characteristic X. As a result, the acoustic signal processing apparatus 3 separately controls the signal output level of the low frequency component of the input acoustic signal and the signal output level of the high frequency component of the signal, achieving dynamic loudness control which is most suitable for the characteristic of the acoustic signal.

Figure 3:
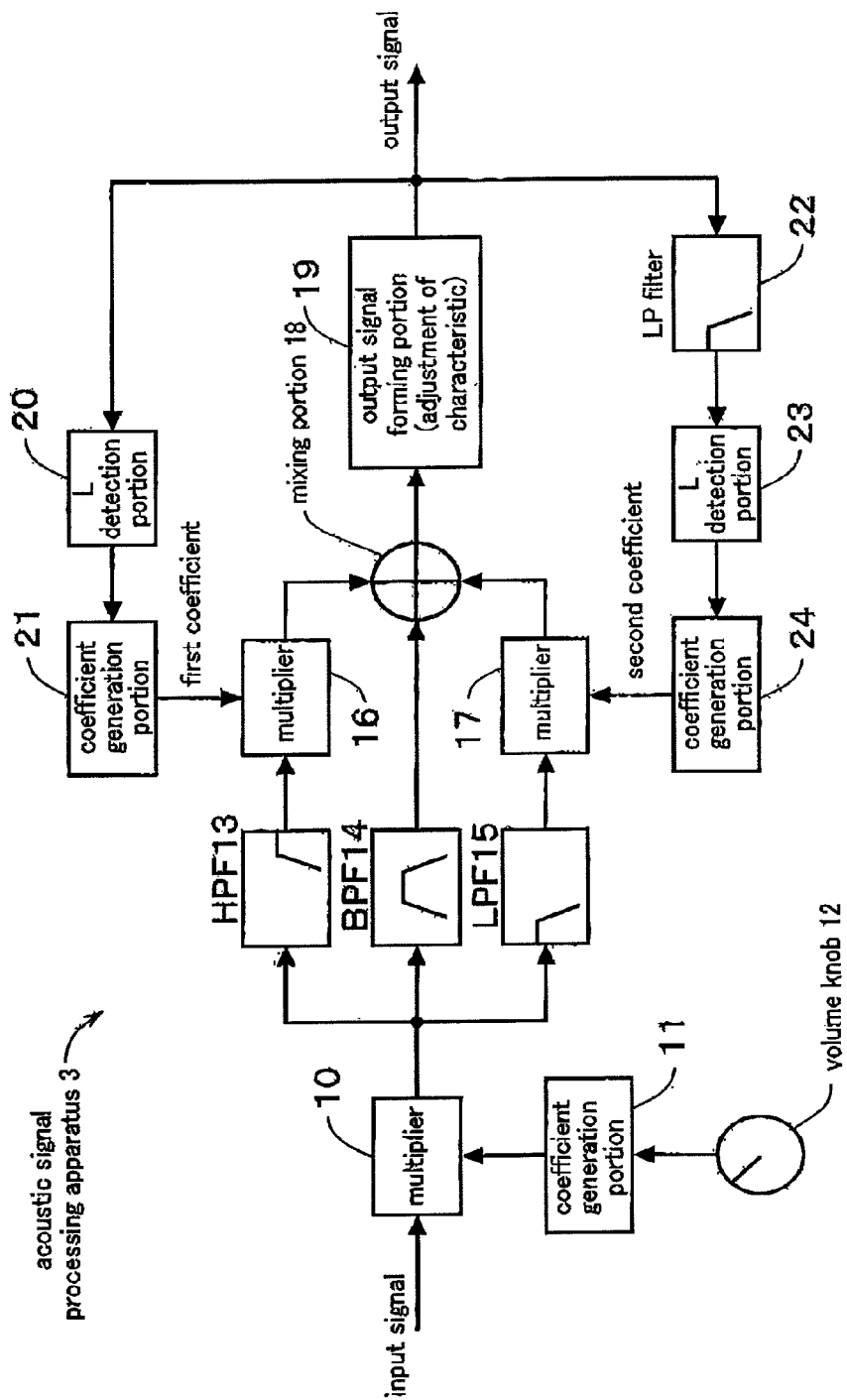
FIG. 3 is a circuit block diagram indicative of a configuration of the acoustic signal processing apparatus of the first embodiment of the present invention.

FIG. 3 indicates a circuit block diagram indicative of a configuration of the acoustic signal processing apparatus 3 of the first embodiment of the present invention.

In the acoustic signal processing apparatus 3 shown in FIG. 3, an input acoustic signal is input to a multiplier 10 to multiply the input acoustic signal by a coefficient generated by a coefficient generation portion 11 which generates a coefficient corresponding to a rotation angle of a volume knob 12. By the multiplication, the full range volume level of the acoustic signal is controlled in accordance with the rotation angle of the volume knob 12. The acoustic signal output from the multiplier 10 and controlled to have the volume level corresponding to the volume knob is separated by a band separation filter group into a high frequency component, a middle frequency component and a low frequency component according to the band. The band separation filter group is formed of a high-pass filter (HPF) 13 for extracting a high frequency component of an acoustic signal, a band-pass filter (BPF) 14 for extracting a middle frequency component of the acoustic signal and a low-pass filter (LPF) 14 for extracting a low frequency component of the acoustic signal. The high frequency component output from the HPF 13 is multiplied in a multiplier 16 by the first coefficient generated by a coefficient generation portion 21 to control the level of the component. The low frequency component output from the LPF 15 is multiplied in a multiplier 17 by the second coefficient generated by a coefficient generation portion 24 to control the level of the component. The level-controlled high frequency component output from the multiplier 16, the middle frequency component output from the BPF 14 without being level-controlled and the level-controlled low frequency component output from the multiplier 17 are mixed in a mixing portion 18 to be supplied to an output signal forming portion 19. The output signal forming portion 19 controls various kinds of acoustic characteristics of the supplied acoustic signal such as level, frequency response and characteristics in changes in amplitude to form an output signal which is to be supplied to a sound system. The output signal formed by the output signal forming portion 19 is supplied to the power amplifier 4 and the speaker 5 which form the sound system. In a case, for example, where the speaker 5 is a full range speaker which is formed of a single speaker that covers the full band, there is no possibility of phase shift and level variation. In this case, therefore, the acoustic signal processing apparatus 3 is simply required to control only the frequency response of tones which are to be emitted by the speaker. Consequently, the output signal forming portion 19 can be formed only by an equalizer. The equalizer flattens the frequency response of a tone which is to be emitted or boosts the low frequency component of the tone as necessary.

The output signal is branched to be supplied to an L detection portion 20 in which the full band level of the output signal is detected. The L detection portion 20, which is a level detection portion for detecting the level of a supplied acoustic signal, may be a general envelope follower formed of a rectification portion which rectifies acoustic signals, a peak detection portion which detects peaks of rectified acoustic signals at certain periods, and an attack release portion which generates detected level which follows the detected peaks. In this case, the attack release portion generates a detection level which is to be output as follows. If the current detected level is smaller than a detected peak value, the attack release portion raises the detected level to the peak value with a rise time constant to generate the detected level which is to be output. If the current detected level is higher than the detected peak value, the attack release portion lowers the detected level to "0" with a fall time constant to generate the detected level which is to be output. The rise/fall time constants of the L detection portion 20 are 50 milliseconds or more, respectively. For example, the rise/fall time constants are set at 300 to 400 milliseconds that are relatively long. Therefore, the detected level (detection level) will not vary abruptly. By use of the level detected by the L detection portion 20 as a reference input level, a gain for realizing the characteristic X shown in FIG. 2 is generated as the first coefficient by the coefficient generation portion 21. In this case, if the reference input level detected by the L detection portion 20 is situated on the broken line of the gain "1" shown in FIG. 2, the first coefficient is "1". If the reference input level is situated above the broken line, the first coefficient exceeds "1". If the reference input level is situated below the broken line, the first coefficient is less than "1".

The branched output signal is also supplied to an LP filter 22. The LP filter 22 extracts a low frequency component of the output signal. The low frequency component extracted by the LP filter 22 is supplied to an L detection portion 23 to detect the level of the low frequency component of the output signal. The rise time constant of the L detection portion 23 is approximately 5 to 10 milliseconds, while the fall time constant is approximately 20 to 30 milliseconds. Therefore, the acoustic signal processing apparatus 3 is able to promptly follow changes in level of the low frequency component. Using the level detected by the L detection portion 23 as a reference input level, the coefficient generation portion 24 generates a gain which realizes the characteristic X shown in FIG. 2 as the second coefficient. In this case, if the reference input level detected by the L detection portion 23 is on the broken line of the gain "1" shown in FIG. 2, the second coefficient is "1". If the reference input level is above the broken line, the second coefficient exceeds "1". If the reference input level is below the broken line, the second coefficient is less than "1". Since the ultimate aim is to control characteristics of acoustic signals which are to be emitted as tones by the speaker, it is preferable that signals subjected to the level detection for generating the first coefficient and the second coefficient are not acoustic signals situated in the multiplier 17 or the mixing portion 18 to have more steps to go but acoustic signals output from the output signal forming portion 19 to be output to the sound system. In the signal processing performed by the output signal forming portion 19, acoustic signals delay for a plurality of sampling cycles. Therefore, if either of the level detections were done by use of an output signal with the other being done by use of an acoustic signal having steps to go, the timing at which the first coefficient varies would not coincide with the timing at which the second coefficient varies, resulting in unsuccessful control. Therefore, the output signal from the multiplier 17 is not input to the L detection portion 23.

In a case where the volume knob 12 is turned down by a user so that the volume of an acoustic signal output from the multiplier 10 will fall within the low volume range as a whole irrespective of band, the level of the reference input signal serving as the full band level of the signal detected by the L detection portion 20 falls within the low volume range. In this case, therefore, the first coefficient generated in accordance with the characteristic X exceeds "1". Because this coefficient is to be multiplied in the multiplier 16 by the high frequency component output from the HPF 13, the level control is performed such that the level of the high frequency component is raised. Because the level of the reference input signal serving as the level of the low frequency component detected by the L detection portion 23 also falls within the low volume range, the second coefficient generated in accordance with the characteristic X exceeds "1". Because the second coefficient is to be multiplied in the multiplier 17 by the low frequency component output from the LPF 15, the level control is performed such that the level of the low frequency component is also raised.

Although there is some correlation between the level of the full band and the level of the low frequency component of an acoustic signal, these levels are basically independent of each other. Therefore, the reference input level detected by the L detection portion 20 and the reference input level detected by the L detection portion 23 vary independently of each other according to frequency response of a currently processed acoustic signal. More specifically, the acoustic signal processing apparatus 3 separately controls the gain of a low frequency component and the gain of a high frequency component of an acoustic signal. In a case where the tone volume of an acoustic signal is adjusted to enter the low volume range to perform the loudness control, therefore, the gain of the high frequency component and the gain of the low frequency component are dynamically controlled in accordance with frequency response of an acoustic signal which is to be supplied to the speaker, achieving dynamic loudness control. If the whole tone volume level increases to enter the middle or higher volume range, the level control performed according to the characteristic X restrains high frequency component of an acoustic signal, but restrains low frequency component only when the volume level of the low frequency component increases to enter the middle or higher volume range. In other words, the acoustic signal processing apparatus 3 can output the low frequency component from the speaker as much as possible within the limit the speaker can permit.

Figure 4:
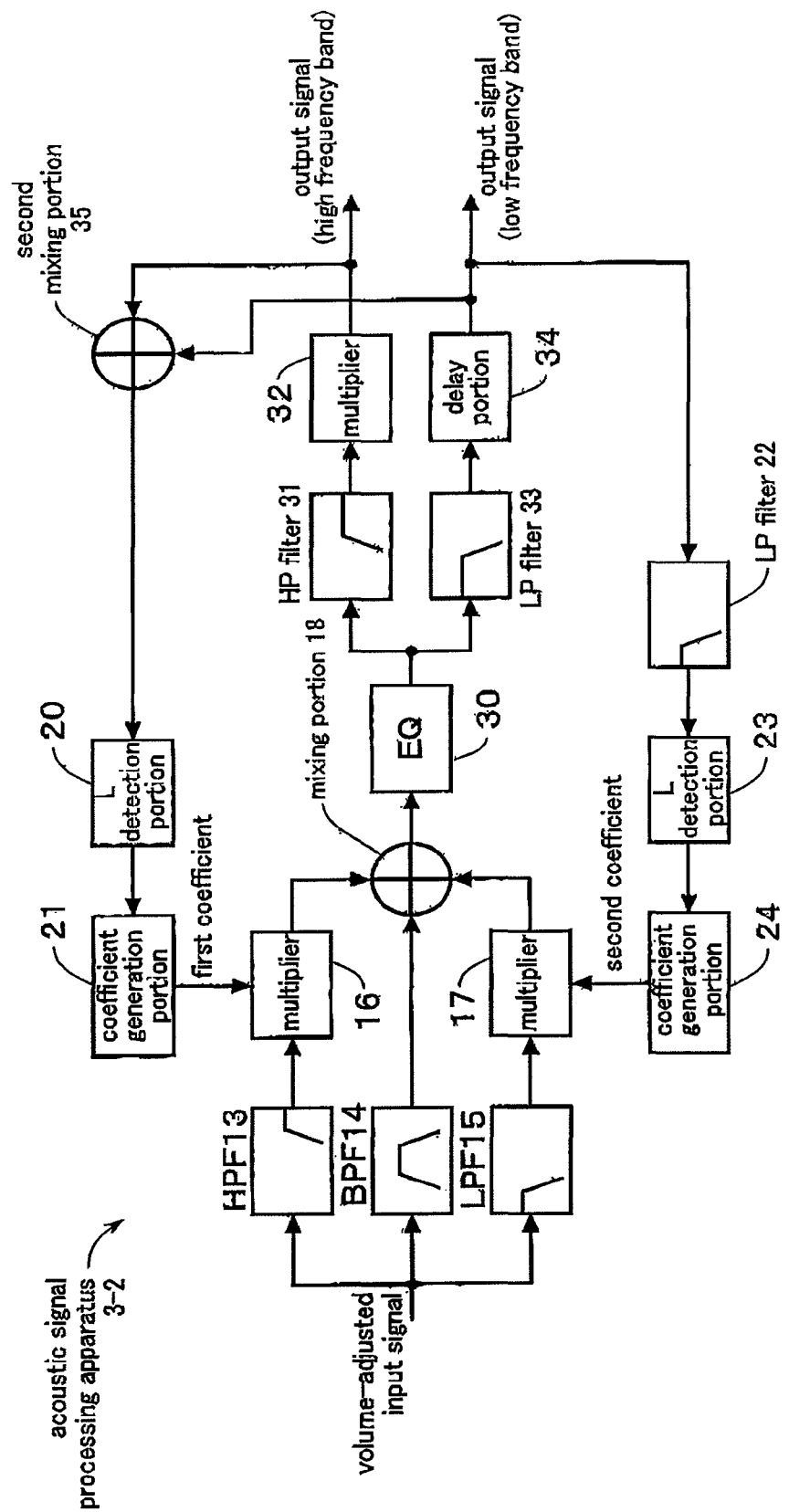
FIG. 4 is a circuit block diagram indicative of a configuration of the acoustic signal processing apparatus of the second embodiment of the present invention.

FIG. 4 indicates a circuit block diagram indicative of a configuration of an acoustic signal processing apparatus 3-2 of the second embodiment of the present invention. The sound system to which the acoustic signal processing apparatus 3-2 of the invention is to output signals has a multi-amp configuration formed of the plurality of speakers 5 corresponding to a plurality of bands and the plurality of power amplifiers 4 for individually driving the speakers, respectively. For the sake of simplifying explanation, FIG. 4 indicates an example of a 2-way speaker system. In this example, an acoustic signal is divided into high frequency and low frequency bands by a channel divider. As the power amplifiers 4, a power amplifier provided specifically for high frequency band and a power amplifier provided specifically for low frequency band are provided, while the 2-way speaker formed of a speaker for high frequency band (tweeter) and a speaker for low frequency band (woofer) is provided as the speakers 5. In a case of n-way speaker system, an acoustic signal is divided into n bands by the channel divider.

In the acoustic signal processing apparatus 3-2 for multi-amp system shown in FIG. 4, although the multiplier 10, the coefficient generation portion 11 and the volume knob 12 shown in FIG. 3 are not shown, an acoustic signal whose level has been controlled according to the rotation angle of the volume knob 12 is input to the band separation filter group. In the band separation filter group, the input signal is separated according to band into a high frequency component, a middle frequency component and a low frequency component by the HPF 13, the BPF 14 and the LPF 15. The high frequency component output from the HPF 13 is multiplied in the multiplier 16 by the first coefficient generated by the coefficient generation portion 21 to control the level of the component. The low frequency component output from the LPF 15 is multiplied in the multiplier 17 by the second coefficient generated by the coefficient generation portion 24 to control the level of the component.

The level-controlled high frequency component output from the multiplier 16, the middle frequency component output from the BPF 14 without being level-controlled and the level-controlled low frequency component output from the multiplier 17 are mixed in the mixing portion 18 to adjust acoustic characteristics of the acoustic signal by an equalizer (EQ) 30. The EQ 30 is provided mainly in order to flatten the frequency response of tones which are to be output from the speakers. Therefore, the frequency response of the equalizer 30 may be set in accordance with the speakers to which acoustic signals are supplied. The output from the EQ 30 is supplied to an HP filter 31 and an LP filter 33 in parallel. In this case, the HP filter 31 and the LP filter 33 serve as channel dividers to separate an acoustic signal supplied from the EQ 30 into a band component (hereafter referred to as "a high frequency component") which is to be supplied to the high frequency speaker and a low frequency component which is to be supplied to the low frequency speaker. Depending on the bands covered by the respective speakers which form the 2-way speaker system, therefore, the frequencies (cut-off frequencies) separated by the HP filter 31 and the LP filter 33 vary.

The high frequency component of an acoustic signal extracted by the HP filter 31 is supplied to a multiplier 32 to adjust a coefficient (gain) by which the high frequency component is to be multiplied in the multiplier 32 so that the level of a tone which is to be output from the high frequency speaker on the basis of the high frequency component will be balanced with the level of a tone which is to be output from the low frequency speaker. In a case of a generalized n-way speaker system, an acoustic signal is to be separated into n band components by channel dividers. With the lowest frequency component among them being defined as a reference, respective levels of the remaining (n−1) band components are adjusted so that the respective levels will match with the level of the lowest frequency component. In this case, therefore, the number of the multipliers 32 is (n−1). From the multiplier 32, an output signal of the high frequency component is output to be amplified by the power amplifier provided specifically for high frequencies to be supplied to the high frequency speaker (tweeter). The low frequency component extracted by the LP filter 33 is supplied to a delay portion 34 at which the low frequency component is delayed so that the phase of the low frequency component will be in phase with that of the high frequency component. In this specification, an expression "the two bands are in phase" indicates that two band components contained in an acoustic signal are emitted from the speakers at approximately the same timing. In a case where the two band components are not in phase, either of the two band components can be delayed as necessary (that is, timing adjustment) so that the delayed band component can be in phase with the other band component. Although the acoustic signal processing apparatus 3-2 is designed such that only the low frequency component will be adjusted, the acoustic signal processing apparatus 3-2 may have a delay portion for high frequency component to allow adjustment of the high frequency component. In the case of n-way system, the number of delay portion 34 is (n−1). With the highest frequency component being defined as a reference, in this case, the timing of the remaining (n−1) band components are adjusted so that the timing of the respective remaining band components will match with that of the highest frequency component. From the delay portion 34, an output signal is output to be amplified by the power amplifier provided specifically for low frequencies to be supplied to the low frequency speaker (woofer). In the case of n-way system, output signals of n bands adjusted by the (n−1) multipliers 32 and (n−1) delay portions 34 are amplified by n power amplifiers to be supplied to n speakers. In the case of the acoustic signal processing apparatus 3-2 of the second embodiment, as described above, the total of 5 blocks from the EQ 30 to the delay portion 34 (in the case of the n-way system, the total of (2n−1) blocks) form the output signal forming portion which forms output signals.

The output signal of the high frequency component and the output signal of the low frequency component are branched to be supplied to a second mixing portion 35 to be mixed. The mixed full band output signal is supplied to the L detection portion 20. In the case of n-way system, output signals of n-bands are branched to be mixed in the second mixing portion 35, so that the mixed full band output signal is supplied to the L detection portion 20. Because the L detection portion 20, the coefficient generation portion 21 and the multiplier 16 operate similarly to those of the acoustic signal processing apparatus 3 of the first embodiment shown in FIG. 3, the explanation of the respective operations will be omitted. However, the first coefficient is generated by the coefficient generation portion 21 such that even if the level of the full band output signal varies, the first coefficient will slowly follow the full band output signals without varying abruptly. The first coefficient is then supplied to the multiplier 16.

The branched low frequency output signal is also supplied to the LP filter 22. The LP filter 22 extracts a low frequency component of the low frequency output signal to supply the extracted component to the L detection portion 23. In the case of the n-way system, among all the branched output signals, branched output signals of the bands ranging from the lowest band to m-band are mixed in a third mixing portion which is not shown. The mixed output signal for m bands is supplied to the LP filter 22 to extract a low frequency component to supply the extracted component to the L detection portion 23. The high frequency part of the signal supplied to the LP filter 22 has been cut off by the LP filter 33 which serves as a channel divider and filters for the m bands. In a case where the cutoff is adequate enough, therefore, the LP filter 22 may be omitted. In this case, the low frequency output signal or the signal output from the third mixing portion is directly supplied to the L detection portion 23. Because the L detection portion 23, the coefficient generation portion 24 and the multiplier 17 operate similarly to those of the acoustic signal processing apparatus 3 of the first embodiment shown in FIG. 3, the explanation of the respective operations will be omitted. However, the second coefficient is generated by the coefficient generation portion 24 such that the second coefficient will quickly follow changes in the level of the low frequency component of the output signal. The second coefficient is then supplied to the multiplier 17.

In the acoustic signal processing apparatus 3-2 of the second embodiment, the L detection portion 20 detects the level of the full band output signal as a reference input level, while the L detection portion 23 detects the level of the low frequency component of the output signal as a reference input level. Therefore, the reference input level detected by the L detection portion 20 and the reference input level detected by the L detection portion 23 vary according to the frequency response of an input acoustic signal. In accordance with the characteristic X, the first coefficient corresponding to the reference input level detected by the L detection portion 20 is generated to perform the level-control for the high frequency component by use of the first coefficient. In accordance with the characteristic X, furthermore, the second coefficient corresponding to the reference input level detected by the L detection portion 23 is generated to perform the level-control for the low frequency component by use of the second coefficient. In a case where the loudness control is to be performed due to low volume, therefore, the acoustic signal processing apparatus 3-2 achieves dynamic loudness control that makes the frequency response of a volume suitable for the characteristic of an input acoustic signal. If the volume level of any of the bands of an acoustic signal increases, the acoustic signal processing apparatus 3-2 controls to restrain the high frequency component of the acoustic signal. However, the acoustic signal processing apparatus 3-2 restrains the low frequency component of the acoustic signal only when the volume level of the band increases. Therefore, the acoustic signal processing apparatus 3-2 controls to output the low frequency component from the low frequency speaker as much as possible within the limit the speaker can permit.

Figure 5:
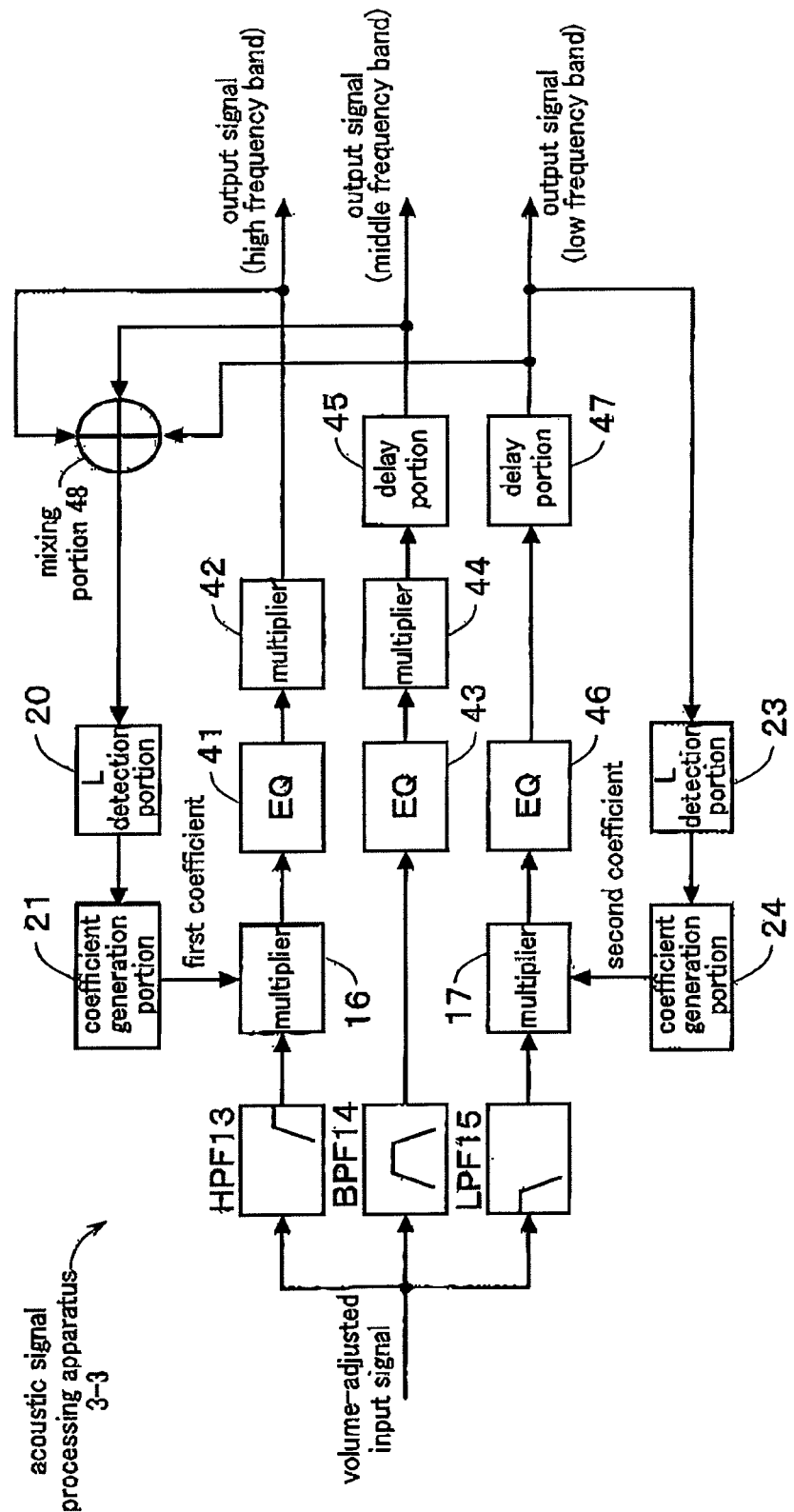
FIG. 5 is a circuit block diagram indicative of a configuration of the acoustic signal processing apparatus of the third embodiment of the present invention.
Figure 6:
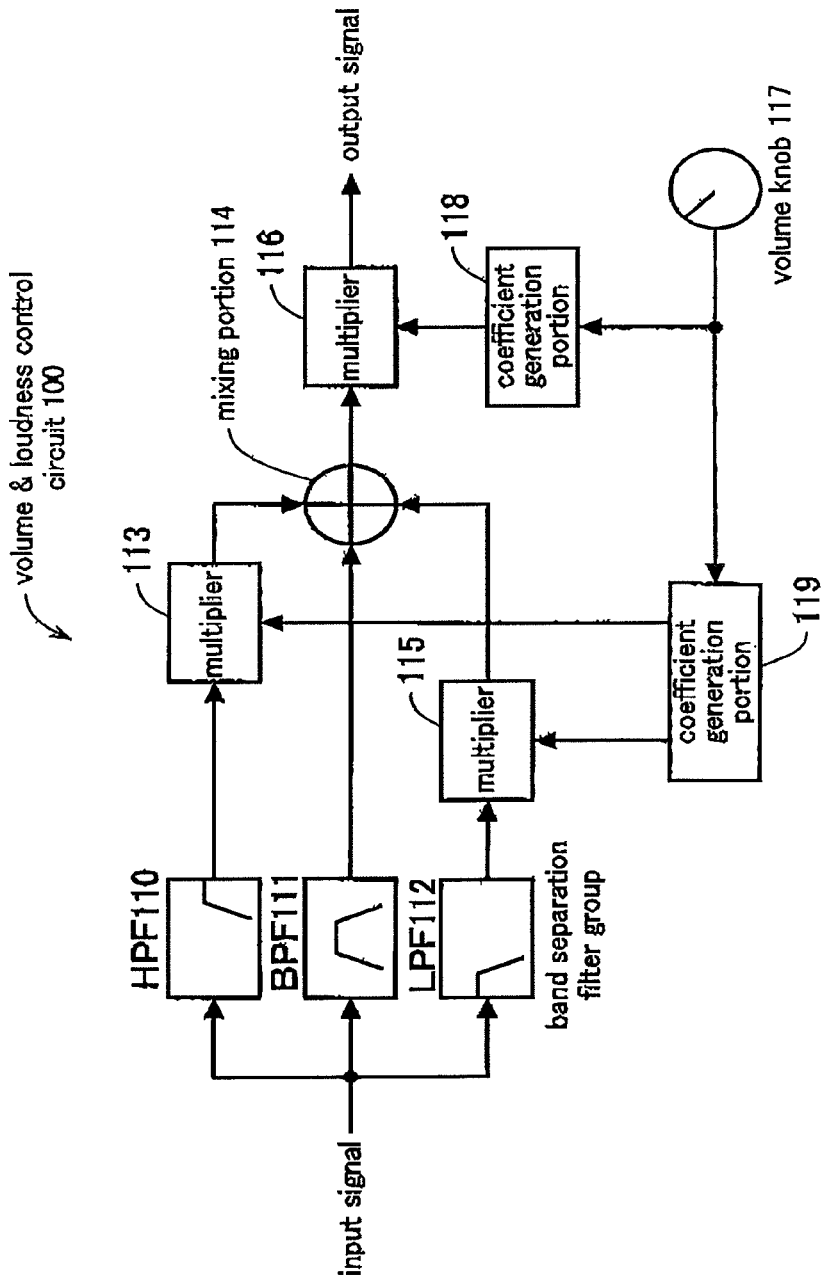
FIG. 6 is a circuit block diagram indicative of a configuration of the conventional volume and loudness control circuit.

FIG. 5 indicates a circuit block diagram indicative of a configuration of an acoustic signal processing apparatus 3-3 of the third embodiment of the present invention. The acoustic signal processing apparatus 3-3 of the third embodiment of the invention indicates a case of a sound system formed of the power amplifiers 4 and the speakers 5 having a multi-amp configuration of 3-way speaker system. In this example, furthermore, the HP filter 13, the BP filter 14 and the LP filter 15 which serve as band separation filters for loudness control are also used as band separation filters for channel dividers. In this multi-amp system, an acoustic signal is divided into high frequency, middle frequency and low frequency bands by the channel dividers. As the power amplifiers 4, power amplifiers provided specifically for high frequency band, for middle frequency band and for low frequency band are provided, respectively, while a 3-way speaker formed of a speaker for high frequencies (tweeter), a speaker for middle frequencies (squawker) and a speaker for low frequencies (woofer) is provided as the speakers 5.

In the acoustic signal processing apparatus 3-3 for multi-amp system shown in FIG. 5, although the multiplier 10, the coefficient generation portion 11 and the volume knob 12 shown in FIG. 3 are not shown, an acoustic signal whose level has been controlled according to the rotation angle of the volume knob 12 is input to the band separation filter group. The band separation filter group separates the input signal according to band into a high frequency component, a middle frequency component and a low frequency component by the HPF 13, the BPF 14 and the LPF 15. In this case, the HPF 13, BPF 14 and the LPF 15 serve as channel dividers to separate the acoustic signal into a high frequency component which is to be supplied to the high frequency speaker, a middle frequency component which is to be supplied to the middle frequency speaker and a low frequency component which is to be supplied to the low frequency speaker. Depending on the bands covered by the respective speakers, therefore, the frequencies (cut-off frequencies) separated by the HPF 13, the BPF 14 and the LPF 15 vary.

The high frequency component output from the HPF 13 is multiplied in the multiplier 16 by the first coefficient generated by the coefficient generation portion 21 to control the level of the component. The low frequency component output from the LPF 15 is multiplied in the multiplier 17 by the second coefficient generated by the coefficient generation portion 24 to control the level of the component. The frequency response of the high frequency component whose level has been controlled in the multiplier 16 is controlled by an EQ 41. The frequency response of the middle frequency component extracted by the BPF 14 is controlled by an EQ 43. The frequency response of the low frequency component whose level has been controlled in the multiplier 17 is controlled by an EQ 46. The EQ 41, EQ 43 and EQ 46 are provided in order to flatten respective frequency responses of tones which are to be output from the speakers for the respective bands. Therefore, the respective frequency responses of the EQ 41, EQ 43 and EQ 46 are set in accordance with the respective bands' speakers to which acoustic signals are supplied. Because the frequency band of acoustic signals which are to be input is limited to high frequencies, middle frequencies or low frequencies depending on the three equalizers, each equalizer can be configured to have only the filter (approximately 10 bands) which controls the frequency response of the limited band. Therefore, the amount of the signal processing performed by the three equalizers is slightly more than that of the signal processing normally performed only by a single equalizer (approximately 31 bands). In the case of the EQ 41, more specifically, the EQ 41 can be configured only by a filter which controls characteristic of the high frequency components which pass through the HP filter 13.

The high frequency component whose acoustic characteristic has been adjusted by the EQ 41 is supplied to a multiplier 42 to adjust the level of the high frequency component which is to be supplied to the high frequency speaker so that the level of a tone which is to be output from the high frequency speaker will be balanced with the level of a tone which is to be output from the low frequency speaker. From the multiplier 42, an output signal of the high frequency component is output to be amplified by the power amplifier provided specifically for high frequencies to be supplied to the high frequency speaker (tweeter). The middle frequency component whose acoustic characteristic has been adjusted by the EQ 43 is supplied to a multiplier 44 to adjust the level of the middle frequency component which is to be supplied to the middle frequency speaker so that the level of a tone which is to be output from the middle frequency speaker will be balanced with the level of a tone which is to be output from the low frequency speaker. The middle frequency component supplied from the multiplier 44 is supplied to a delay portion 45 at which the phase of the middle frequency component is delayed so that the phase of the middle frequency component will be in phase with that of the high frequency component. From the delay portion 45, an output signal of the middle frequency band is output to be amplified by the power amplifier provided specifically for the middle frequencies to be supplied to the middle frequency speaker (squawker). The low frequency component whose acoustic characteristic has been adjusted by the EQ 46 is supplied to a delay portion 47 at which the phase of the low frequency component is delayed so that the phase of the low frequency component will be in phase with that of the high frequency component. From the delay portion 47, an output signal of the low frequency band is output to be amplified by the power amplifier provided specifically for the low frequencies to be supplied to the low frequency speaker (woofer). In the case of the acoustic signal processing apparatus 3-3 of the third embodiment, as described above, 7 blocks ranging from the EQ 41 to the delay portion 47 form the output signal forming portion which adjusts output signals.

The respective output signals of the high frequency component, the middle frequency component and the low frequency component are branched to be supplied to a mixing portion 48 to be mixed. The mixed full band output signal is supplied to the L detection portion 20. Because the L detection portion 20, the coefficient generation portion 21 and the multiplier 16 operate similarly to those of the acoustic signal processing apparatus 3 of the first embodiment shown in FIG. 3, the explanation of the respective operations will be omitted. However, the first coefficient is generated by the coefficient generation portion 21 such that even if the level of the full band output signal varies, the first coefficient will slowly follow the full band output signal without varying abruptly. The first coefficient is then supplied to the multiplier 16. The branched low frequency output signal is supplied to the L detection portion 23 to detect the level of the low frequency component of the output signal. Because the low frequency output signal itself is the low frequency component of the output signal, there is no necessity to provide an LP filter before the L detection portion 23. Because the L detection portion 23, the coefficient generation portion 24 and the multiplier 17 operate similarly to those of the acoustic signal processing apparatus 3 of the first embodiment shown in FIG. 3, the explanation of the respective operations will be omitted. However, the second coefficient is generated by the coefficient generation portion 24 such that the second coefficient will quickly follow changes in the level of the low frequency component of the output signal. The second coefficient is then supplied to the multiplier 17.

In the acoustic signal processing apparatus 3-3 of the third embodiment as well, the L detection portion 20 detects the level of the full band output signal as a reference input level, while the L detection portion 23 detects the level of the low frequency component of the output signal as a reference input level. Therefore, the reference input level detected by the L detection portion 20 and the reference input level detected by the L detection portion 23 vary depending on the frequency response of an input acoustic signal. In accordance with the characteristic X, the first coefficient corresponding to the reference input level detected by the L detection portion 20 is generated to perform the level-control for the high frequency component by use of the first coefficient. In accordance with the characteristic X, furthermore, the second coefficient corresponding to the reference input level detected by the L detection portion 23 is generated to perform the level-control for the low frequency component by use of the second coefficient. In a case where the loudness control is performed due to low volume, therefore, the acoustic signal processing apparatus 3-3 achieves dynamic loudness control that makes the frequency response of a volume suitable for the characteristic of an input acoustic signal. If the whole tone volume level increases, the level control performed according to the characteristic X restrains high frequency component of an acoustic signal, with the low frequency component being output from the low frequency speaker as much as possible within the limit the speaker can permit. In the acoustic signal processing apparatus 3-3 of the third embodiment, the band separation filters for the loudness control are also used as channel dividers. Compared with the second embodiment, therefore, the third embodiment reduces the signal processing corresponding to the band separation filters serving as channel dividers and the signal processing corresponding to the LP filter 22. In addition, the increase in the signal processing for the equalizers 41, 43 and 46 is slight. With less signal processing than a case where the second embodiment is configured by a 3-way speaker system, therefore, the third embodiment realizes the dynamic loudness control equivalent to that performed by the second embodiment.

The acoustic signal processing apparatuses according to the embodiments of the present invention described above can disable the "dynamic loudness control" according to the present invention by fixing both the first coefficient and the second coefficient at "1" by user's instruction. The "dynamic loudness control" according to the present invention can be also applied not only to the speaker processor but also to other signal processing apparatuses (effect processors). In this case, it is preferable that a block of an acoustic signal processing apparatus is used as an effect of mono input, mono output.

Furthermore, the acoustic signal processing apparatus according to the present invention is designed such that the adjustment processing performed by the output signal forming portion is formed of the control of frequency response performed by the EQs, the level control performed by the multipliers and the delay control performed by the delay portions. However, the adjustment processing may include only part of the controls or may include other processing such as compression processing, modulation processing and non-linear conversion processing.

In addition, it is preferable that the filtering characteristic of the LP filter 22 of the acoustic signal processing apparatuses of the first and second embodiment of the present invention is the same filtering characteristic of the LPF 15. In this case, the characteristic of the LP filter 22 is not necessarily exactly the same as that of the LPF 15, but may be different more or less.

What is claimed is:

1. An acoustic signal processing apparatus which is configured to receive an input acoustic signal and to output an output acoustic signal, the acoustic signal processing apparatus comprising:

a band separation portion for separating the input acoustic signal into a high frequency component, a middle frequency component and a low frequency component;

a first level control portion for controlling a level of the high frequency component in accordance with a first control signal to output the controlled high frequency component;

a second level control portion which controls a level of the low frequency component in accordance with a second control signal to output the controlled low frequency component;

a mixing portion for mixing the high frequency component output from the first level control portion, the middle frequency component output from the band separation portion and the low frequency component output from the second level control portion to output a mixed signal;

a first control signal generation portion which is configured to detect a volume level of the mixed signal to generate the first control signal in accordance with the detected volume level; and a second control signal generation portion which is configured to detect a volume level of a low frequency component of the mixed signal to generate the second control signal in accordance with the detected volume level.

2. The acoustic signal processing apparatus according to claim 1, further comprising an output acoustic signal forming portion which is configured to form the output acoustic signal from the mixed signal output of the mixing portion.

3. The acoustic signal processing apparatus according to claim 2, wherein the first control signal generation portion is adapted to detect a volume level of the output acoustic signal output from the output acoustic signal forming portion as the volume level of the mixed signal, and the second control signal generation portion is adapted to detect a volume level of a low frequency component of the output acoustic signal output from the output acoustic signal forming portion as the volume level of the low frequency component of the mixed signal.

4. The acoustic signal processing apparatus according to claim 3, wherein the second control signal generation portion includes a low pass filter for extracting a low frequency component of the output acoustic signal output from the output acoustic signal forming portion.

5. The acoustic signal processing apparatus according to claim 2, wherein the output acoustic signal forming portion is further configured to form the output acoustic signal from the mixed signal output of the mixing portion by adjusting an acoustic characteristic of the mixed signal output from the mixing portion.

6. The acoustic signal processing apparatus according to claim 1, wherein the detection of the volume level by the first control signal generation portion is done by use of a certain first rise time constant and a first fall time constant; and the detection of the volume level by the second control signal generation portion is done by use of a certain second rise time constant and a second fall time constant which are shorter than the certain first rise time constant and the first fall time constant.

7. The acoustic signal processing apparatus according to claim 1, wherein the output acoustic signal is to be supplied to a sound system;

the sound system is a multi-amp system in which a plurality of speakers corresponding to a plurality of bands are configured to be driven by a plurality of amplifiers corresponding to the speakers; and the acoustic signal processing apparatus further comprises an output acoustic signal forming portion which is configured to separate the mixed signal output from the mixing portion into acoustic signals corresponding to the plurality of bands, respectively, to adjust respective acoustic characteristics of the acoustic signals separated into the bands to form the output acoustic signal formed of the plurality of acoustic signals which are to be supplied to the amplifiers.

8. The acoustic signal processing apparatus according to claim 7, wherein another mixing portion is configured to mix the acoustic signals corresponding to the plurality of bands separated by the output acoustic signal forming portion to output another mixed signal, wherein the first control signal generation portion is adapted to detect a volume level of the another mixed signal output from the another mixing portion as the volume level of the another mixed signal, and the second control signal generation portion is adapted to detect a volume level of a low frequency component of the output acoustic signal output from the output acoustic signal forming portion as the volume level of the low frequency component of the mixed signal.

9. The acoustic signal processing apparatus according to claim 8, wherein the second control signal generation portion includes a low pass filter for extracting a low frequency component of the output acoustic signal output from the output acoustic signal forming portion.

10. The acoustic signal processing apparatus according to claim 7, wherein the detection of the volume level by the first control signal generation portion is done by use of a certain first rise time constant and a first fall time constant; and the detection of the volume level by the second control signal generation portion is done by use of a certain second rise time constant and a second fall time constant which are shorter than the certain first rise time constant and the first fall time constant.

* * * * *